United States Patent [19]
Hayward et al.

[11] Patent Number: 6,124,546
[45] Date of Patent: *Sep. 26, 2000

[54] INTEGRATED CIRCUIT CHIP PACKAGE AND METHOD OF MAKING THE SAME

[75] Inventors: James Hayward, Santa Clara; Quang Nguyen, Milpitas, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/984,547

[22] Filed: Dec. 3, 1997

[51] Int. Cl.⁷ ...................................................... H01L 23/28
[52] U.S. Cl. .......................... 174/52.2; 361/762; 361/770; 257/687; 257/778; 257/770
[58] Field of Search ........................... 174/52.2; 257/687, 257/778, 688, 790, 788; 361/762, 770

[56] References Cited

U.S. PATENT DOCUMENTS

| | | | |
|---|---|---|---|
| 5,019,673 | 5/1991 | Juskey et al. | 174/52.2 |
| 5,126,278 | 6/1992 | Kodaira | 437/24 |
| 5,285,352 | 2/1994 | Pastore et al. | 361/707 |
| 5,490,324 | 2/1996 | Newman | 29/830 |
| 5,814,894 | 9/1998 | Igarashi et al. | 257/787 |
| 5,834,835 | 11/1998 | Maekawa | 257/680 |
| 5,844,315 | 12/1998 | Melton et al. | 257/738 |

FOREIGN PATENT DOCUMENTS

| | | |
|---|---|---|
| 0297991 | 4/1989 | European Pat. Off. . |
| 2740906 | 9/1997 | France . |
| 3912891 | 8/1990 | Germany . |
| 62-101053 | 5/1987 | Japan . |
| 2204182 | 2/1988 | United Kingdom . |

*Primary Examiner*—William A. Cuchlinski, Jr.
*Assistant Examiner*—Ronnie Mancho

[57] ABSTRACT

A semiconductor integrated circuit chip package includes top and bottom interposers 2 and 4, a semiconductor die 14 attached to the top interposer 2, a wirebond 18 or a flipchip connector 52 connected between the die 14 and the top interposer 2, and a tab bond 22 providing an electrical connection from the wirebond 18 or the flipchip connector 52 to outside the bottom interposer 4. A method of making the chip package includes providing top and bottom interposers 2 and 4, attaching a semiconductor die 14 to the top interposer 2, providing a wirebond 18 or a flipchip connector 52 between the die 14 and the top interposer 2, providing a tab bond 22 between the top and bottom interposers 2 and 4, and providing an encapsulant 16 to fill the intermediate volume 40 between the top and bottom interposers 2 and 4.

17 Claims, 5 Drawing Sheets

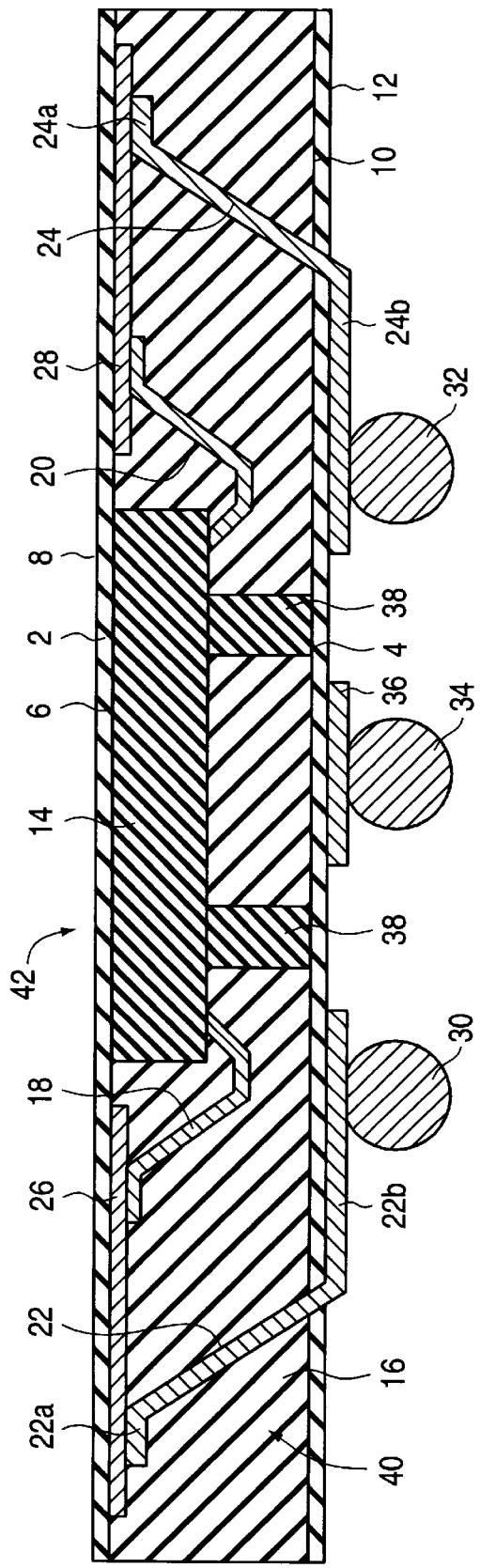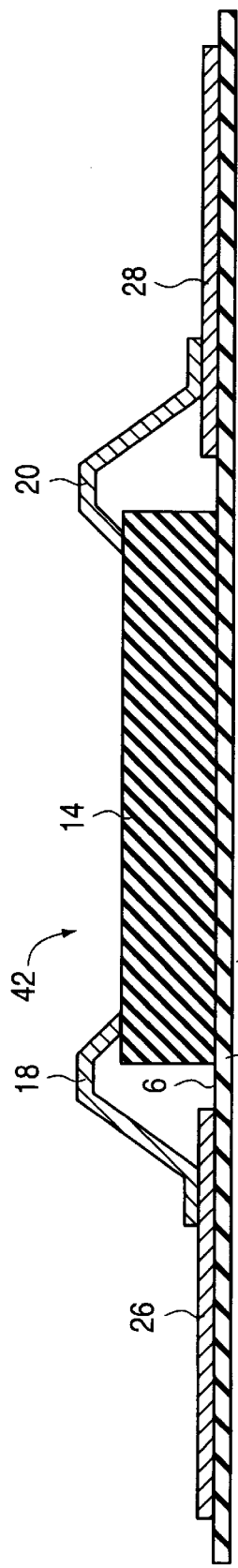

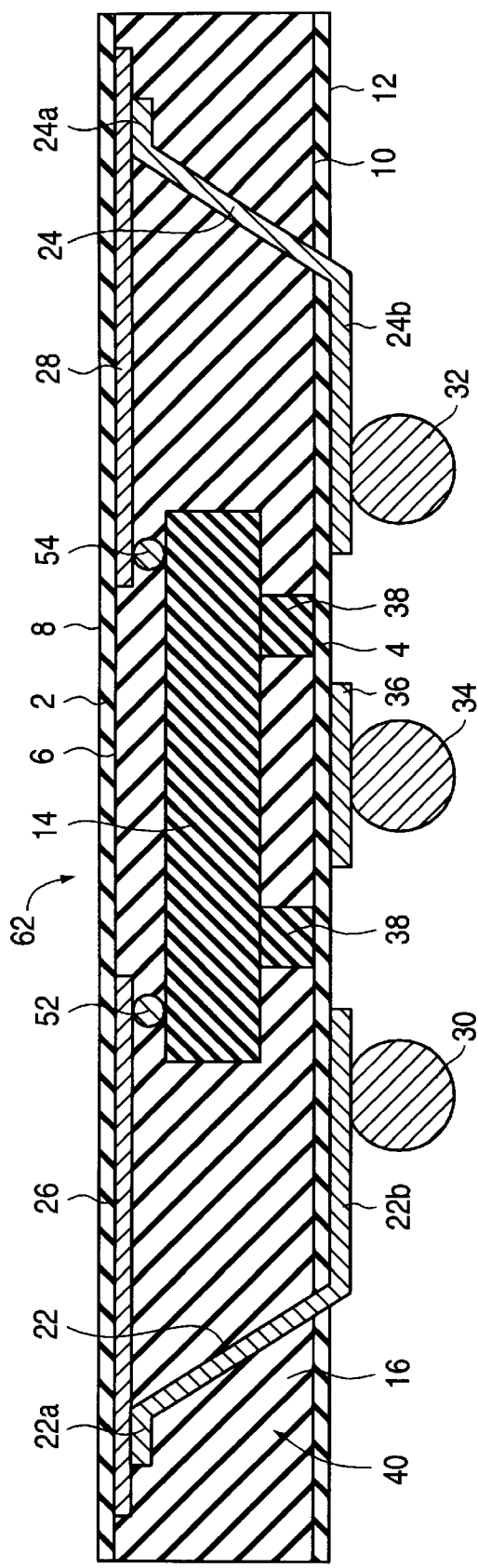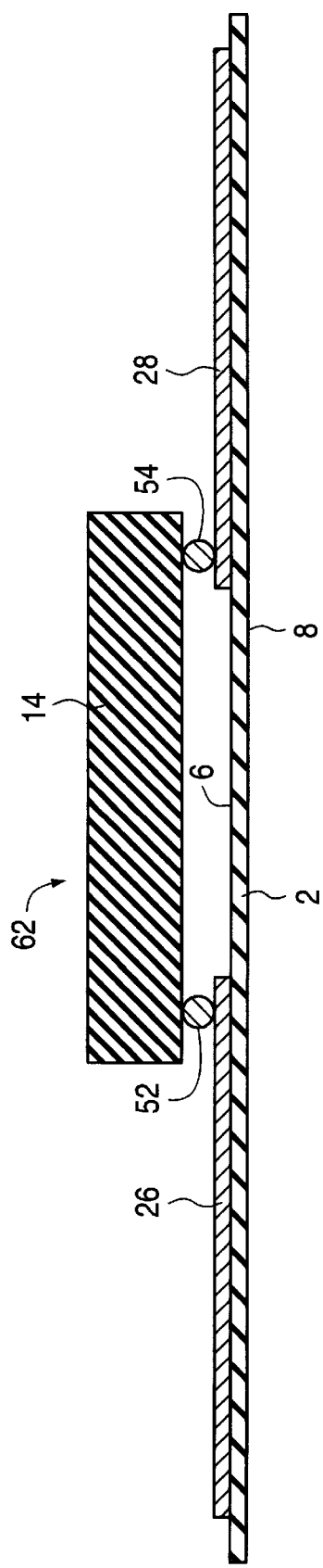
FIG. 4
FIG. 5

6,124,546

INTEGRATED CIRCUIT CHIP PACKAGE AND METHOD OF MAKING THE SAME

TECHNICAL FIELD

The present invention relates to an integrated circuit chip package and a method of fabricating the same.

BACKGROUND ART

The semiconductor chip industry has developed1 "chip scale" packages for protecting an integrated circuit on a semiconductor die and for providing wire connections from the integrated circuit to other circuits outside the chip. An example of a conventional chip package is a flex/tape-BGA package, which includes a semiconductor die directly attached to an interposer. The flex/tape-BGA package allows for a constant package body and a constant solder ball pattern independent of the size of the die to some extent. However, the flex/tape-BGA package requires a rigid connection between the die and the interposer, thereby resulting in a problem of decreased solder joint reliability. Examples of the flex/tape-BGA package include Texas Instruments Microstar®, Fujitsu FBGA and Amkor FlexBGA® packages.

Another type of a conventional chip package is a microBGA® package, an example of which is developed by Tessera Inc. The microBGA® package generally has an improved solder joint reliability compared to the flex/tape-BGA package. The microBGA® package includes tab-like bonds for providing electrical connection between the semiconductor die and solder balls outside the interposer. However, the design of the interposer in the microBGA® package is governed by the die size and the bond pad position, and is very sensitive to changes in the die size. In a conventional microBGA® package, a different interposer design with a different tab bond and solder ball pattern is usually required for any change in die size.

Therefore, there is a need for an integrated circuit chip package that simultaneously provides both a good solder joint reliability and a single interposer design with a constant tab bond and solder ball pattern that can accommodate a variety of die sizes.

DISCLOSURE OF THE INVENTION

The present invention satisfies these needs. In accordance with the present invention, an integrated circuit chip package generally comprises:

(a) a bottom interposer having an inside surface and an outside surface;

(b) a top interposer spaced apart from the bottom interposer, the top interposer having an inside surface and an outside surface;

(c) an encapsulant connected between the inside surfaces of the top and bottom interposers;

(d) a die surrounded by the encapsulant and one of the interposers; and (e) a wirebond connected between the die and one of the interposers.

In an embodiment, the chip package further includes a wirebond pad on the inside surface of the top interposer and a tab bond. The tab bond includes a first portion in direct contact with the wirebond pad and a second portion in direct contact with the outside surface of the bottom interposer. The wirebond is directly connected to the wirebond pad which establishes an electrically conductive path between the wirebond and the tab bond.

In an additional embodiment, a solder ball is directly connected to the second portion of the tab bond. In a further embodiment, a spacer is provided on the inside surface of the bottom interposer to support the die, such that the die and the wirebond are spaced apart from the bottom interposer.

The present invention further provides a method of fabricating the integrated circuit chip package, the method generally comprising the steps of:

(a) providing a top interposer;

(b) attaching a semiconductor die to the top interposer;

(c) providing a wirebond or a flipchip connector between the silicon die and the top interposer, the top interposer and the silicon die forming a first assembly;

(d) providing a bottom interposer;

(e) attaching the first assembly to the bottom interposer, the top and bottom interposers spaced apart by an intermediate volume;

(f) providing a tab bond between the top and bottom interposer; and (g) providing an encapsulant to fill the intermediate volume between the top and the bottom interposers.

In an embodiment, the step of attaching the first assembly includes providing a spacer between the first assembly and the bottom interposer to space the die and the wirebond apart from the bottom interposer. In a further embodiment, an elastomeric material is flooded into the intermediate volume between the top and the bottom interposers to fill the volume.

Advantageously, the present invention provides an integrated circuit chip package that is expected to provide an improved solder joint reliability. Another advantage of the invention is that it is expected to allow a single interposer design with the same solder ball pattern to accommodate different die sizes and wirebond positions.

BRIEF DESCRIPTION OF THE DRAWINGS

The present invention will be described with respect to particular embodiments thereof, and references will be made to the drawings in which:

FIG. 1 is a sectional side view of an embodiment of an integrated circuit chip package with a first assembly including a plurality of wirebonds in accordance with the present invention;

FIG. 2 is a sectional side view of the first assembly of FIG. 1;

FIG. 4 is a sectional side view of another embodiment of an integrated circuit chip package with a first assembly including a plurality of flipchip connectors in accordance with the present invention;

FIG. 5 is a sectional side view of the first assembly of the integrated circuit chip package of FIG. 4;

MODES FOR CARRYING OUT THE INVENTION

Figure 3:
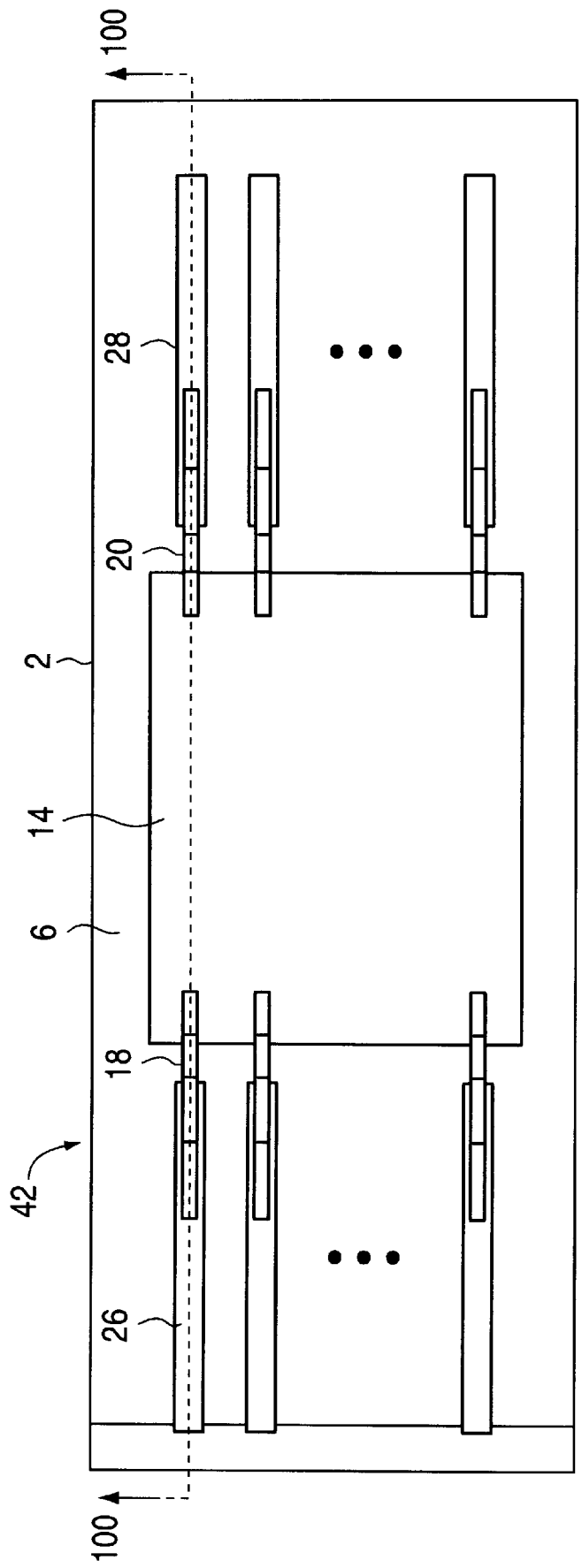
FIG. 3 is a simplified top plan view of the first assembly of FIG. 2.

The present invention provides an integrated circuit chip package that is expected to improve the solder joint reliability without the need to customize the design of the interposer to accommodate different die sizes.

FIG. 1 is a sectional side view of an integrated circuit chip package according to the present invention, with a top interposer 2 and a bottom interposer 4, both made of an insulating material, spaced apart from each other. The top interposer 2 has an inside surface 6 and an outside surface 8, and the bottom interposer 4 has an inside surface 10 and an outside surface 12. Although FIG. 1 shows the top and bottom interposers 2 and 4 being of the same size, the top interposer 2 may be smaller than the bottom interposer 4. The top and bottom interposers 2 and 4 are generally parallel to each other. A semiconductor die 14, an example of which is a silicon die, is surrounded by an encapsulant 16, such as one made of an elastomeric material, connected between the inside surface 6 of the top interposer 2 and the inside surface 10 of the bottom interposer 4. The die 14 is positioned on the inside surface 6 of the top interposer 2.

A conductive wirebond 18, such as one made of a metal, is connected between the semiconductor die 14 and the top interposer 2. Connection of the wirebond 18 between the die 14 and the top interposer 2 can be made by using a conventional wirebonding method that is apparent to a person skilled in the art. A conductive wirebond pad 26, such as a metallic pad, is usually provided on the inside surface 6 of the top interposer 2, and the wirebond 18 is directly connected to the wirebond pad 26. In a semiconductor chip package, a plurality of wirebonds are usually provided to connect the integrated circuit (not shown) embedded in the semiconductor die 14 and the interposer 2. As an illustrative example, FIG. 1 shows an additional wirebond pad 28 on the inside surface 6 of the top interposer 2 and an additional wirebond 20 connected between a different portion of the semiconductor die 14 and the additional wirebond pad 28.

The integrated circuit chip package according to the present invention also includes a conductive tab bond 22, such as one made of a metal, connected between the top and bottom interposers 2 and 4. In an embodiment, the tab bond includes a first portion 22a that is in direct contact with the wirebond pad 26 on the inside surface 6 of the top interposer 2, and a second portion 22b that is in direct contact with the outside surface 12 of the bottom interposer 4. The tab bond 24 may be attached to the wirebond pad 28 on the inside surface 6 of the top interposer 2 by thermosonic, ultrasonic, solder reflow or other means.

The tab bond 22 provides a structural support for the top and the bottom interposers 2 and 4, and an electrical connection from the wirebond pad 26 to outside of the chip package. In general, a semiconductor chip package includes a plurality of tab bonds to provide structural integrity to the package assembly and a plurality of electrical connections. As an illustrative example, FIG. 1 shows an additional tab bond 24 including a first portion 24a in direct contact with the additional wirebond pad 28 on the inside surface 6 of the top interposer 2 and a second portion 24b in direct contact with the outside surface 12 of the bottom interposer 4.

The wirebond pad 26, such as one made of a metallic material or a conductive polymer, is provided on the inside surface 6 of the top interposer 2 such that an electrically conductive path is established between the integrated circuit (not shown) on the die 14 and the second portion 22b outside the bottom interposer 4. Namely, the wirebond 18 is in direct contact with the integrated circuit and the wirebond pad 26, and the first portion 22a of the tab bond 22 is in direct contact with the wirebond pad 26 and the second portion 22b. In a further embodiment, a plurality of wirebond pads are provided in the chip package. In general, a separate wirebond pad is provided for each wirebond, and a separate tab bond is directly connected to each wirebond pad. As an illustrative example, FIG. 1 shows the additional wirebond pad 28 to which the wirebond 20 is directly connected. In a manner similar to the connection of the tab bond 22, the first portion 24a of the tab bond 24 is in direct contact with the additional wirebond pad 28.

In an additional embodiment, the integrated circuit chip package according to the present invention further includes a solder ball 30 directly connected to the second portion 22b of the tab bond 22 by soldering. In a similar manner, an additional solder ball 32 is directly soldered to the second portion 24b of the tab bond 24. Furthermore, at least one additional solder ball 34 can be provided on the bottom interposer 4 to provide additional electrical connection and structural support for the chip package. For example, a metallic layer 36 with a thickness the same as that of the second portions 22b and 24b of the tab bonds 22 and 24 can be provided on the outside surface 12 of the bottom interposer 4, and the solder ball 34 may be directly soldered to the metallic layer 36. Additional solder balls similar to the solder ball 34, which do not have any electrical contact with any of the wirebonds connected to the semiconductor die 14, may be provided for structural support; however, they are not critical to the present invention. On the other hand, the solder balls 30 and 32 serve as electrical contacts because they are electrically connected to the wirebonds 18 and 20 through the tab bonds 22 and 24 and the wirebond pads 26 and 28, respectively.

In a further embodiment, the integrated circuit chip package according to the present invention further includes a spacer 38 of an insulating material, such as an elastomeric material, on the inside surface of one of the interposers or on the die surface. For example, in the chip package wherein the semiconductor die 14 is directly attached to the inside surface 6 of the top interposer 2, a plurality of spacers 38 can be connected between the semiconductor die 14 and the inside surface 10 of the bottom interposer 4, as shown in FIG. 1. The spacer 38 provides structural support for the semiconductor die 14 and leaves an intermediate volume 40 between the inside surfaces 6 and 10 of the top and bottom interposers 2 and 4. The encapsulant 16 may be flooded into the intermediate volume 40 to fill the remaining space between the top and bottom interposers 2 and 4. An elastomeric material can be used as the encapsulant 16. The spacer 38 can also be used to separate the semiconductor die 14 from the inside surface 10 of the bottom interposer 4 so that the wirebond 18 is spaced apart from the inside surface 10 of the bottom interposer 4. In some applications, it is desirable to avoid a direct contact between the wirebond 18 and the inside surface 10 of the bottom interposer 4. As shown in FIG. 1, the wirebonds 18 and 20, which are suspended from the semiconductor die 14, are spaced apart from the bottom interposer 4. The spacer 38 can be provided, for example, by attaching a plurality of columns of an elastomeric material onto the inside surface 10 of the bottom interposer 4 before attaching the die 14 to the spacer 38 or by using a pad of an elastomeric material on the surface of the die 14.

The present invention also provides a method of fabricating the integrated circuit chip package described above in accordance with the present invention. The method roughly comprises the steps of:

providing a top interposer 2;

attaching a semiconductor die 14 to the top interposer 2;

providing a wirebond 18 or a flipchip connector 52 between the semiconductor die 14 and the top interposer 2 to form a first assembly 42;

attaching the first assembly 42 to the bottom interposer 4, the top and bottom interposers 2 and 4 spaced apart by an intermediate volume 40;

providing a tab bond 22 between the top and bottom interposers 2 and 4; and providing an encapsulant 16 to fill the intermediate volume 40 between the top and bottom interposers 2 and 4.

Furthermore, a wirebond pad 26 is attached to the inside surface 6 of the top interposer 2. The assembly of the semiconductor die 14 to the top interposer 2 can be made by using a conventional die attachment method which is apparent to a person skilled in the art. The wirebond 18 is then connected between the integrated circuit (not shown) embedded in the semiconductor die 14 and the wirebond pad 26. The wirebond connections can be made by a conventional wirebond process which is apparent to a person skilled in the art. In another embodiment in which flipchip connections are used, the flipchip connections can be made by a conventional flipchip process which is known to a person skilled in the art.

After the first assembly 42 is made, a spacer 38, such as one made of an elastomeric material, is provided on the inside surface 10 of the bottom interposer 4 or on the surface of the die 14, and the first assembly 42 of FIG. 2 is then attached to the bottom interposer 4 by attaching the semiconductor die 14 directly to the spacer 38. The spacer 38, which spaces the top and bottom interposers 2 and 4 apart by an intermediate volume 40, also allows the wirebond 18 to be suspended from the semiconductor die 14 the wirebond pad 26 before the encapsulant 16 is injected such that there is no direct contact between the wirebond 18 and the inside surface 10 of the bottom interposer 4.

The tab bond 22 between the top and bottom interposers 2 and 4 is then made with the first portion 22a of the tab bond 22 in direct contact with the wirebond pad 26 and the second portion 22b in direct contact with the outside surface 12 of the bottom interposer 4. The tab bond 22 is formed and assembled to penetrate through the bottom interposer 4 such that an electrical connection is established by the tab bond 22 from the wirebond 18 through the wirebond pad 26 to an electrical contact outside the chip package, such as the solder ball 30. The tab bonds 22 and 24 can be fabricated by using a conventional tab bonding method that is apparent to a person skilled in the art. Subsequently, the remaining intermediate volume 40 between the inside surfaces 6 and 10 of the top and bottom interposers 2 and 4 is filled with an encapsulant 16, for example, by flooding the intermediate volume 40 with an elastromeric material.

FIG. 2 shows a sectional side view of the first assembly 42 of FIG. 1 before it is assembled with the bottom interposer 4. The sectional view of FIG. 2 is opposite the view of the first assembly 42 in FIG. 1 with respect to the top and bottom. During the process of making the first assembly 42, the inside surface 6 of the top interposer 2 is usually positioned upward when the wirebond pads 26 and 28 and the silicon die 14 are attached to the inside surface 6 of the top interposer 2. The wirebonds 18 and 20 are connected between the semiconductor die 14 and the wirebond pads 26 and 28, respectively, when the inside surface 6 of the top interposer 2 is positioned to face upward. After the first assembly 42 is completed, it is attached to the bottom interposer 4 with the encapsulant 16 and the tab bonds 22 and 24, thereby resulting in an integrated circuit chip package with the first assembly 42 on top of the bottom interposer 4 as shown in FIG. 1 and described above.

FIG. 3 is a simplified top plan view of the first assembly 42 of FIG. 2 showing the silicon die 14 on the inside surface 6 of the top interposer 2, wirebond pads 26 and 28 on the surface 6, and wirebonds 18 and 20 connected between the semiconductor die 14 and the wirebond pads 26 and 28, respectively. The sectional view of FIG. 2 is taken along section line 100—100 in the top plan view of FIG. 3. A typical integrated circuit chip assembly usually includes more wirebonds and wirebonds pads than those which are shown in FIG. 3, and the wirebond and tab pads may have a variety of patterns on the inside surface 6 of the top interposer 2. For example, whereas FIG. 3 shows the wirebond connections from two sides of the semiconductor die 14, wirebond connections can also be made from all four sides of the die 14. They are nonetheless within the scope of the present invention.

FIG. 4 shows a sectional side view of another embodiment of the present invention in which a plurality of flipchip connectors 52 and 54 are provided between the semiconductor die 14 and the conductive pads 26 and 28, respectively, instead of the wirebond connections 18 and 20 of FIG. 1. In this embodiment, the semiconductor die 14 is not directly attached to the inside surface 6 of the top interposer 2. The flipchip connectors 52 and 54 provide direct electrical connections between the integrated circuit embedded on the semiconductor die 14 and the pads 26 and 28, respectively. Flipchip connectors 52 and 54 are usually solder ball connectors but may also be metalcoated polymer balls or electrically conductive adhesives. The tab bonds 22 and 24 are assembled to provide electrical connections between the pads 26 and 28 and the solder balls 30 and 32, respectively, outside the bottom interposer 4, in a manner similar to that which is shown in FIG. 1 and described above. A plurality of spacers 38 may be provided to space the semiconductor die 14 apart from the inside surface 10 of the bottom interposer 4, although the spacers 38 are optional and are used to provide structural support to the first assembly 62 of FIG. 5 when the encapsulant 16 is flooded to fill the intermediate volume 40 of FIGS. 1 and 4 between the top and the bottom interposers 2 and 4 during the assembly process.

FIG. 5 shows a sectional side view of the first assembly 62 of FIG. 4 with the flipchip connectors 52 and 54 before the first assembly 62 is attached to the bottom interposer 4. The orientation of the first assembly 62 in FIG. 5 is opposite that of the first assembly 62 in FIG. 4 with respect to the top and bottom. During the process of making the first assembly 62, the inside surface 6 of the top interposer 2 is usually positioned upward when the conductive pads 26 and 28 are attached to the inside surface 6. The flipchip connectors 52 and 54 are then positioned on the conductive pads 26 and 28, respectively, and the silicon die 14 is attached to the flipchip connectors 52 and 54, such that proper electrical connections are made between the integrated circuit embedded on the semiconductor die 14 and the conductive pads 26 and 28. Alternatively, the flipchip connectors 52 and 54 can be provided on the die 14 prior to attachment to the conductive pads 26 and 28. After the first assembly 62 is made according to FIG. 5, it is attached to the bottom interposer 4 with the tab bonds 22 and 24 and the encapsulant 16 to form the integrated circuit chip package as shown in FIG. 4. The first assembly 62 is usually positioned on top of the bottom interposer 4 when the assembly process is finished.

Figure 6:
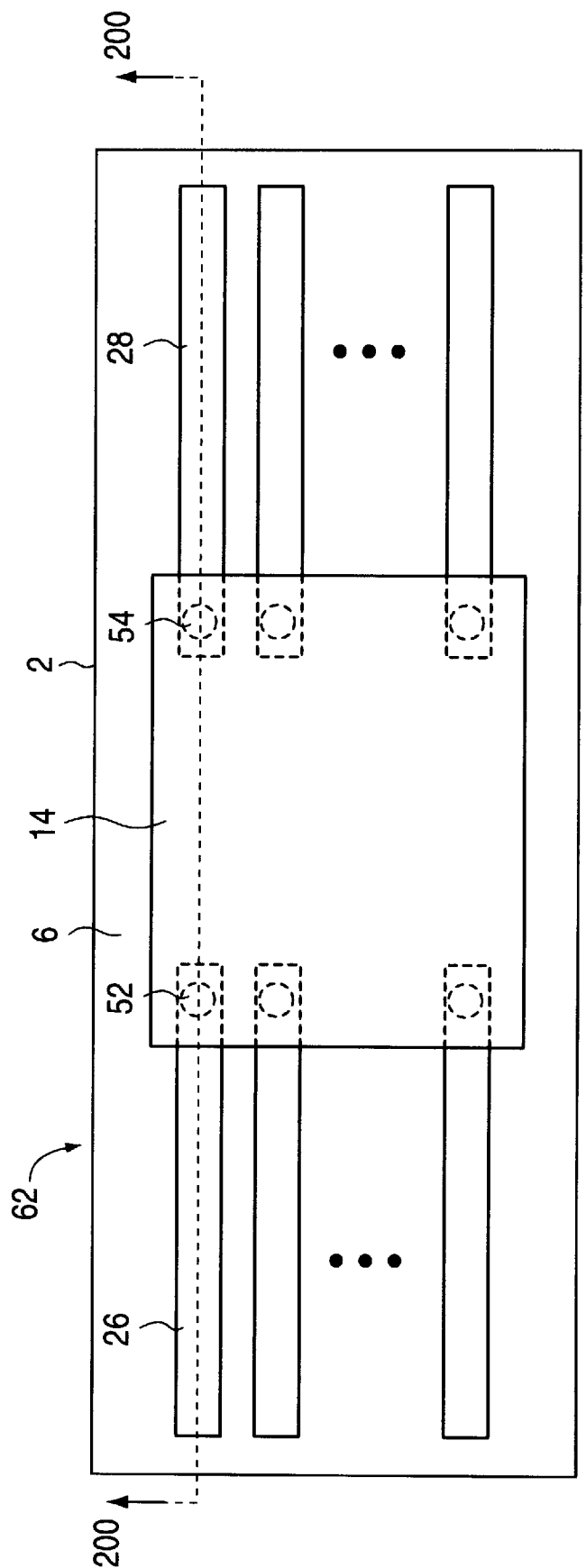
FIG. 6 is a simplified top plan view of the first assembly of FIG. 5.

FIG. 6 is a simplified top plan view of the first assembly 62 of FIG. 5, with the semiconductor die 14 shown in a dashed rectangle as if it is transparent to expose the flipchip connectors 52 and 54. The flipchip connectors 52 and 54 are directly attached to the conductive pads 26 and 28 and the die 14, respectively. The sectional view of FIG. 5 is taken along section line 200—200 in the top plan view of FIG. 6. In general, a plurality of pads more than those which are shown in FIG. 6 may be provided in an integrated circuit package, and a variety of conductive pad patterns may be provided on the inside surface 6 of the top interposer 2. For example, whereas FIG. 6 shows the flipchip connections from two sides of the semiconductor die 14, flipchip connections can also be made from all four sides of the die 14. They are nonetheless within the scope of the present invention.

Figure 7:
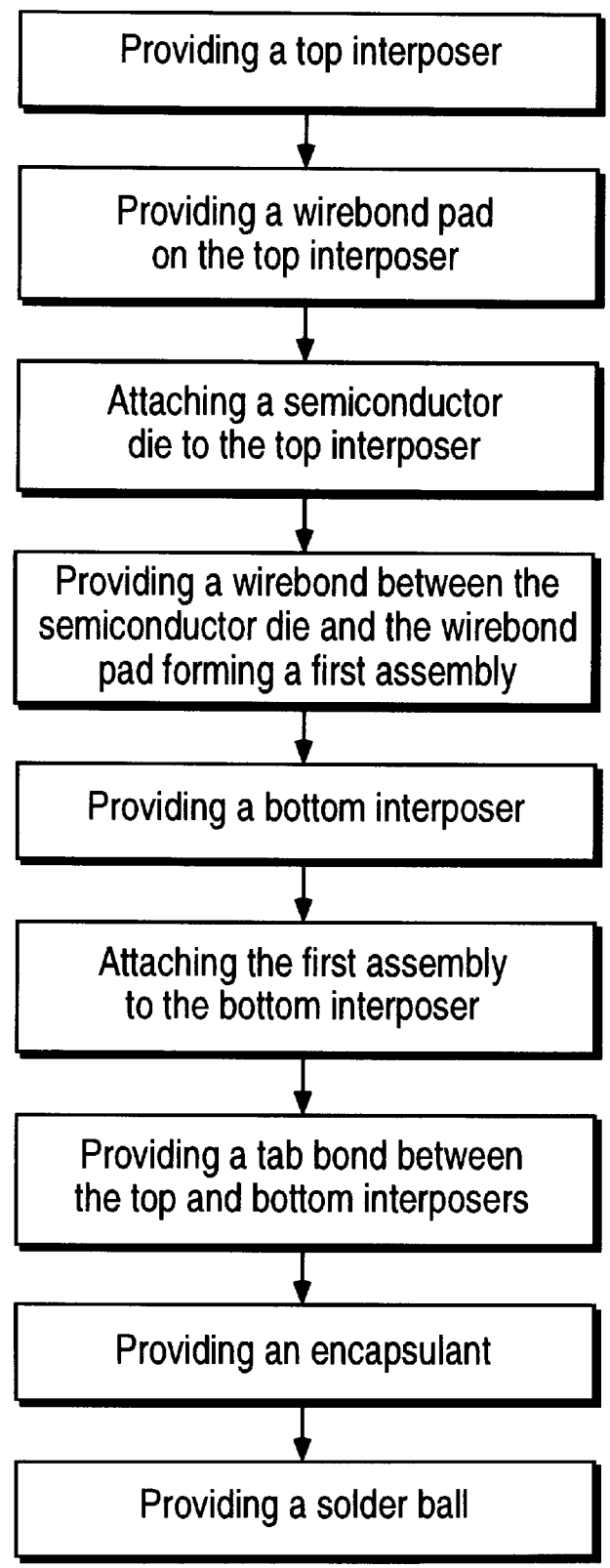
FIG. 7 is a block diagram showing an embodiment of the process of fabricating the integrated circuit chip package of FIG. 1 according to the present invention.

An embodiment of a method of making the integrated chip package of FIG. 1 according to the present invention is illustrated by the flowchart of FIG. 7. The method includes the steps of:

providing a top interposer 2;

providing a wirebond pad 26 on the top interposer 2;

attaching a semiconductor die 14 to the top interposer 2;

providing a wirebond 18 between the semiconductor die 14 and the wirebond pad 26, the top interposer 2, the wirebond pad 26, the semiconductor die 14 and the wirebond 18 forming a first assembly 42;

providing a bottom interposer 4;

attaching the first assembly 42 to the bottom interposer 4 with a spacer 38 spacing the semiconductor die 14 and the wirebond 18 apart from the bottom interposer 4, the top and bottom interposers 2 and 4 substantially parallel to each other and spaced apart by an intermediate volume 40;

providing a tab bond 22 between the top and bottom interposers 2 and 4, the tab bond 22 including a first portion 22*a* in direct contact with the wirebond pad 26 and a second portion 22*b* in direct contact with the bottom interposer 4;

providing an encapsulant 16 to fill the intermediate volume 40 between the top and bottom interposers 2 and 4; and providing a solder ball 30 directly connected to the second portion 22*b* of the tab bond 22.

Furthermore, the spacer 38 and the encapsulant 16 both comprise an elastomeric material. The encapsulant 16 can be provided to fill the intermediate volume 40 between the top and bottom interposers 2 and 4 by flooding the elastomeric material into the remaining intermediate volume 40 of FIGS. 1 and 4 between after the first assembly 62 is attached to the bottom interposer 4 and the tab bonds 22 and 24 are made. In another embodiment, a flipchip connector 52 is used to connect the die 14 with the pad 26 as shown in FIGS. 4–6, instead of the wirebond 18 as shown in FIGS. 1–3.

The method of fabrication described above and illustrated in the flowchart of FIG. 7 is only one of several embodiments of fabricating the chip package. The integrated circuit chip package according to the present invention is not limited to that which is fabricated by using the method described above; it will be appreciated that other methods of fabrication are also possible to produce the chip package according to the present invention.

An advantage of the chip package according to the present invention is that the design of the tab bonds 22 and 24 and the pattern of the solder balls 30, 32 and 34 can be made constant and independent of the size of the semiconductor die 14 as long as adequate space is provided for the semiconductor die 14 and the wirebonds 18 and 20. Since the size of the chip package is mainly determined by the tab bonds and the solder ball pattern, a chip package with a fixed overall dimension can accommodate a variety of different die sizes. A further advantage of using two interposers 2 and 4 is that one interposer, such as the top interposer 2, can be used for direct attachment of the die 14 while a second interposer, such as the bottom interposer 4, can be used for supporting solder joint connections, such as the solder balls 30 and 32, through the second portions 22*b* and 24*b* of the tab bonds 22 and 24. This configuration avoids the necessity for a rigid connection between the semiconductor die 14 and the bottom interposer 4. Therefore, solder joint reliability of the solder balls 30 and 32 is improved.

INDUSTRIAL APPLICABILITY

The integrated circuit chip package according to the present invention is applicable for the packaging of a wide variety of semiconductor integrated circuits, and more particularly, for the packaging of semiconductor dies with a variety of die sizes. The chip package is believed to be superior to the flex/tape-BGA packages in that it is expected to provide an improved solder joint reliability by avoiding a rigid connection between the die and the interposer to which the solder balls are connected. Moreover, the chip package according to the present invention is believed to be superior to the microBGA package in that a single package design with the same tab bond and solder ball pattern can accommodate a variety of die sizes.

The method according to the present invention is applicable for the fabrication of the semiconductor chip package of the present invention. However, the chip package according to the present invention is not limited by the method of fabrication described in the Modes for Carrying Out the Invention; other methods of fabrication are also possible.

The invention has been described with respect to particular embodiments thereof, and numerous modifications can be made which are within the scope of the invention as set forth in the claims.

What is claimed is:

1. An integrated circuit chip package comprising:
    (a) a bottom interposer having an inside surface and an outside surface;
    (b) a top interposer spaced apart from the bottom interposer, the top interposer having an inside surface and an outside surface;
    (c) an encapsulant connecting the inside surfaces of the top and bottom interposers with an interface therebetween;
    (d) a semiconductor die having a top surface and a bottom surface opposing the inside surface of the bottom interposer, the top surface of the semiconductor die in direct contact with the inside surface of the top interposer; and
    (e) a wirebond connected between the bottom surface of the semiconductor die and the top interposer.

2. The package of claim 1, further comprising a spacer on the inside surface of the bottom interposer facing the bottom surface of the semiconductor die.

3. The package of claim 2, wherein the spacer comprises an elastomeric material.

4. The package of claim 2, wherein the wirebond is spaced apart from the bottom interposer.

5. The package of claim 1, wherein the top interposer is substantially parallel to the bottom interposer.

6. An integrated circuit chip package comprising:
    (a) a bottom interposer having an inside surface and an outside surface;
    (b) a top interposer spaced apart from the bottom interposer, the top interposer having an inside surface and an outside surface;

(c) an encapsulant connecting the inside surfaces of the top and bottom interposers with an interface therebetween;

(d) a semiconductor die having a top surface and a bottom surface opposing the inside surface of the bottom interposer;

(e) a flipchip connector connecting the top surface of the semiconductor die to the inside surface of the top interposer; and (f) a tab bond connected between the top and bottom interposers.

7. The package of claim 6, further comprising an insulating spacer on the inside surface of the bottom interposer facing the bottom surface of the semiconductor die so that the semiconductor die is spaced apart from the inside surface of the bottom interposer.

8. The package of claim 7, wherein the spacer comprises an elastomeric material.

9. The package of claim 6, wherein the top interposer is substantially parallel to the bottom interposer.

10. The package of claim 1, further comprising a wirebond pad on the inside surface of the top interposer connected to the wirebond.

11. The package of claim 10, further comprising a tab bond connected to the wirebond pad and in direct contact with the outside surface of the bottom interposer.

12. The package of claim 11, further comprising a solder ball in contact with the tab bond on the outside surface of the bottom interposer to provide external electrical connection.

13. The package of claim 6, further comprising a wirebond pad on the inside surface of the top interposer connected to the flipchip connector.

14. The package of claim 13, further comprising a tab bond connected to the wirebond pad and in direct contact with the outside surface of the bottom interposer.

15. The package of claim 14, further comprising a solder ball in contact with the tab bond on the outside surface of the bottom interposer to provide external electrical connection.

16. The package of claim 1, further comprising:

an insulating spacer on the inside surface of the bottom interposer facing the top surface of the chip such that the wirebond is spaced apart from the inside surface of the bottom interposer;

a wirebond pad on the inside surface of the top interposer connected to the wirebond;

a tab bond connected to the wirebond pad and in direct contact with the outside surface of the bottom interposer; and a solder ball in contact with the tab bond on the outside surface of the bottom interposer to provide external electrical connection.

17. The package according to claim 6, further comprising:

an insulating spacer on the inside surface of the bottom interposer facing the bottom surface of the semiconductor die so that the semiconductor die is spaced apart from the inside surface of the bottom interposer;

a wirebond pad on the inside surface of the top interposer connected to the flipchip connector;

a tab bond connected to the wirebond pad and in direct contact with the outside surface of the bottom interposer; and a solder ball in contact with the tab bond on the inside surface of the bottom interposer to provide external electrical connection.

* * * * *